(12) United States Patent
Gong

(10) Patent No.: US 9,570,703 B2
(45) Date of Patent: Feb. 14, 2017

(54) ORGANIC LIGHT EMITTING DISPLAY WITH REINFORCED SEALING STRUCTURE

(71) Applicant: Samsung Display Co., LTD., Yongin, Gyeonggi-Do (KR)

(72) Inventor: Su-Cheol Gong, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/656,463

(22) Filed: Mar. 12, 2015

(65) Prior Publication Data

US 2015/0263310 A1 Sep. 17, 2015

(30) Foreign Application Priority Data

Mar. 17, 2014 (KR) .................. 10-2014-0031003

(51) Int. Cl.
*H01L 29/08* (2006.01)
*H01L 51/52* (2006.01)
*H01L 27/32* (2006.01)
*H01L 51/56* (2006.01)

(52) U.S. Cl.
CPC ....... *H01L 51/5246* (2013.01); *H01L 27/3244* (2013.01); *H01L 51/56* (2013.01); *H01L 2251/566* (2013.01)

(58) Field of Classification Search
CPC ............ H01J 1/63; B32B 37/02; H05B 33/04; H01L 51/10; H01L 33/48
USPC .......................................................... 257/40
See application file for complete search history.

(56) References Cited

U.S. PATENT DOCUMENTS

| 7,749,039 B2* | 7/2010 | Park ..................... H01L 51/5237 313/512 |
| 7,837,530 B2 | 11/2010 | Park |
| 8,067,883 B2* | 11/2011 | Wang .................. H01L 51/5237 313/292 |

(Continued)

FOREIGN PATENT DOCUMENTS

| KR | 10-0703458 B1 | 3/2007 |
| KR | 10-0732817 B1 | 6/2007 |

(Continued)

OTHER PUBLICATIONS

Petzold et al., "Fracture Mechanical Life-Time Investigation of Glass Frit-Bonded Mems Sensors", IEEEE, 2006, pp. 1343-1348.

*Primary Examiner* — Caleb Henry
(74) *Attorney, Agent, or Firm* — Knobbe Martens Olson & Bear LLP

(57) ABSTRACT

An organic light emitting display includes a first substrate; a second substrate opposing the first substrate; and an array of pixels disposed between the first substrate and the second substrate. The display further includes a seal member interposed between and bonded to the first and second substrates to seal a gap between the first and second substrates; a plurality of pillar members positioned between and bonded to the first and second substrates, the plurality of pillar members being positioned outside and spaced from the seal member when viewing in a direction perpendicular to a major surface of the first mother substrate; and a reinforcement member disposed between the first and second substrates, and comprising portions disposed between the seal member and the pillar members. The plurality of pillar members are spaced apart from each other.

11 Claims, 4 Drawing Sheets

(56) References Cited

U.S. PATENT DOCUMENTS

| | | | | |
|---|---|---|---|---|
| 8,120,251 B2* | 2/2012 | Liu | ............ | H05B 33/04 313/504 |
| 8,288,944 B2* | 10/2012 | Lee | ............ | H01L 51/5246 313/504 |
| 8,299,705 B2* | 10/2012 | Choi | ............ | H01L 51/5237 313/512 |
| 8,390,194 B2* | 3/2013 | Choi | ............ | B32B 37/12 313/512 |
| 8,710,492 B2* | 4/2014 | Niboshi | ............ | H01L 51/524 257/40 |
| 8,749,135 B2* | 6/2014 | Liu | ............ | H01L 51/525 313/512 |
| 8,970,022 B2* | 3/2015 | Choi | ............ | H01L 51/5246 257/682 |
| 9,006,970 B2* | 4/2015 | Song | ............ | H05B 33/04 313/500 |
| 9,231,230 B2* | 1/2016 | Roh | ............ | H01L 51/5246 |
| 9,258,853 B2* | 2/2016 | Nishido | ............ | H05B 33/04 |
| 2002/0005696 A1* | 1/2002 | Yamazaki | ............ | G09G 3/2022 315/169.3 |
| 2003/0122476 A1* | 7/2003 | Wang | ............ | H05B 33/04 313/493 |
| 2007/0096631 A1* | 5/2007 | Sung | ............ | G02F 1/1339 313/498 |
| 2007/0159094 A1* | 7/2007 | Oh | ............ | H01L 27/3223 313/512 |
| 2007/0247068 A1* | 10/2007 | Park | ............ | H01L 51/5237 313/512 |
| 2008/0106194 A1* | 5/2008 | Logunov | ............ | B32B 17/06 313/512 |
| 2008/0185960 A1* | 8/2008 | Koshiyama | ............ | H01L 51/5237 313/512 |
| 2009/0039780 A1* | 2/2009 | Kim | ............ | H01L 51/5237 313/512 |
| 2009/0134782 A1 | 5/2009 | Kim | | |
| 2010/0013384 A1* | 1/2010 | Song | ............ | H01L 51/5237 313/504 |
| 2010/0117067 A1 | 5/2010 | Sin et al. | | |
| 2011/0303943 A1 | 12/2011 | Lee et al. | | |
| 2012/0104933 A1* | 5/2012 | Jung | ............ | H01L 51/5246 313/498 |
| 2012/0133278 A1* | 5/2012 | Ryu | ............ | H01L 27/3276 313/512 |
| 2012/0319574 A1* | 12/2012 | Kim | ............ | H01L 51/5246 313/512 |
| 2013/0300284 A1* | 11/2013 | Nishido | ............ | H01L 51/0097 313/511 |
| 2013/0307407 A1* | 11/2013 | Wang | ............ | H05B 33/04 313/512 |
| 2014/0062290 A1* | 3/2014 | Kim | ............ | H01L 51/525 313/504 |
| 2014/0319998 A1* | 10/2014 | Han | ............ | H05B 33/04 313/504 |
| 2015/0084498 A1* | 3/2015 | Choi | ............ | H01L 51/5246 313/504 |
| 2015/0372253 A1* | 12/2015 | Hong | ............ | H01L 51/5246 257/40 |

FOREIGN PATENT DOCUMENTS

| | | |
|---|---|---|
| KR | 10-2009-0054676 A | 6/2009 |
| KR | 10-2010-0009059 A | 1/2010 |
| KR | 10-2010-0052895 A | 5/2010 |
| KR | 10-2011-0040157 A | 4/2011 |
| KR | 10-2011-0135625 A | 12/2011 |

* cited by examiner

ORGANIC LIGHT EMITTING DISPLAY
WITH REINFORCED SEALING STRUCTURE

RELATED APPLICATIONS

This application claims priority to and the benefit of Korean Patent Application No. 10-2014-0031003, filed Mar. 17, 2014 with the Korean Intellectual Property Office, the entire contents of which are incorporated herein by reference in their entirety.

BACKGROUND

1. Field

An aspect of the present invention relates to an organic light emitting display and a method of manufacturing the same.

2. Description of the Related Art

An organic light emitting display is a flat panel display using organic light emitting diodes, and has advantages of wide use temperature range, strong resistance against impact or vibration, wide viewing angle and clean motion picture due to fast response speed, as compared with other flat panel displays. Accordingly, the organic light emitting display has come into the spotlight as a next-generation flat panel display.

However, the organic light emitting display is degraded due to the penetration of oxygen and moisture therein from the outside.

In order to solve this problem, an organic light emitting diode is sealed using an inorganic sealant such as glass frit. In such a frit sealing structure, the space between a substrate and a sealing substrate is completely sealed by curing a melted frit. Thus, a moisture absorbent material does not need to be used, and accordingly, the organic light emitting diode can be more efficiently protected.

SUMMARY

Embodiments provide an organic light emitting display and a manufacturing method for the same, in which a main sealing member, pillar members positioned at an outside of the main sealing member and formed of a material substantially the same as that of the main sealing member, and a reinforcement member positioned between the main sealing member and the pillar members are provided, so that it is possible to prevent damage of the main sealing member due to an external impact and to improve the mechanical strength of the organic light emitting display.

One aspect of the invention provides an organic light emitting display comprising: a first substrate; a second substrate opposing the first substrate; an array of pixels disposed between the first substrate and the second substrate; a seal member interposed between and bonded to the first and second substrates to seal a gap between the first and second substrates; a plurality of pillar members positioned between and bonded to the first and second substrates, the plurality of pillar members being positioned outside and spaced from the seal member when viewing in a direction perpendicular to a major surface of the first mother substrate; and a reinforcement member disposed between the first and second substrates, and comprising portions disposed between the seal member and the pillar members, wherein the plurality of pillar members are spaced apart from each other.

In the foregoing organic light emitting display of claim 1, the seal member and the pillar members may be formed of the same material. The seal member and the pillar members may be formed of glass frit. The reinforcement member may be formed of a polymer resin. The plurality of pillar members may be spaced apart from each other at a predetermined distance of about 100 μm or smaller. The seal member and each of the pillar members may be spaced apart from each other at a predetermined distance. The first and second substrates may respectively comprise first and second side surfaces which are placed in a plane and collectively form a side of the organic light emitting display. The pillar members may comprise third side surfaces placed in the plane. The first, second and third side surfaces may be formed by cutting along a cutting line. The reinforcement member may comprise a fourth side surface placed in the plane. The pillar members may be placed between the seal member and the side when viewing in the direction.

Another aspect of the invention provides a method for manufacturing an organic light emitting display, the method comprising: providing a first substrate and a second substrate; forming an array of pixels between the first and second substrates; forming a seal member between the first and second substrates; forming a plurality of pillar members between the first and second substrates, the pillar members being spaced apart from each other and disposed outside the first sealing member when viewing in a direction perpendicular to a major surface of the first substrate; and forming a reinforcement member between the first and second substrates, the reinforcement member having a bonding force higher than that of the seal and pillar members, the reinforcement member comprising portions disposed between the sealing member and the pillar members.

In the foregoing method, the seal member and the pillar members may be formed of the same material. The seal member and the pillar members are formed of glass frit. The reinforcement member may be formed of a polymer resin. Forming the reinforcement member may comprise injecting a reinforcement material between the first and second substrates. The seal member and each of the pillar members may be formed to be spaced apart from each other at a predetermined distance on the first substrate through a screen printing method. The plurality of pillar members may be spaced apart from each other at a predetermined distance of about 100 μm or smaller.

A further aspect of the invention provides a method for manufacturing an organic light emitting display, the method comprising: providing a first mother substrate and a second mother substrate; forming first and second arrays of pixels over a first mother substrate; forming first and second seal members between the first and second mother substrates, the first and second seal members respectively surrounding the first and second arrays of pixels when viewing in a direction perpendicular to a major surface of the first mother substrate; forming a plurality of pillar members between the first and second mother substrates, the pillar members being spaced apart from each other at a predetermined distance and disposed between the first and second seal members; forming a reinforcement member between the first and second mother substrates and further between the first and second seal members when viewed in the direction, cutting the first and second mother substrates along a cutting line disposed between the first and second seal members when viewed in the direction. In the foregoing method, the pillar members and the reinforcement member may be cut along the cutting line while cutting the first and second mother substrates.

An aspect of the present invention provides an organic light emitting display, including: a first substrate; a display unit disposed on the first substrate; a second substrate disposed on the display unit; a first sealing member configured to seal the first and second substrates; a plurality of second sealing members positioned between the first and second substrates, the plurality of second sealing members being positioned at an outside of the first sealing member; and a reinforcement member disposed between the first and second sealing members, wherein the plurality of second sealing members are spaced apart from each other at a predetermined distance.

The first and second sealing members may be formed of the same material.

The first and second sealing members may be formed of a glass frit.

The reinforcement member may be formed of a polymer resin.

The predetermined distance may be within 100 μm.

The first and second sealing members may be spaced apart from each other at a predetermined distance.

The organic light emitting display may further include a cutting line positioned above the plurality of second sealing members.

An aspect of the present invention provides a method for manufacturing an organic light emitting display, the method including: forming a display unit on a first substrate; preparing a second substrate; forming a first sealing member at an outside of the display unit on the first substrate; forming a plurality of second sealing members spaced apart from each other at a predetermined distance at an outside of the first sealing member; sealing the first and second substrates by the medium of the first and second sealing members; and forming a reinforcement member having a bonding force higher than that of the first or second sealing member between the first and second sealing members.

The first and second sealing members may be formed of the same material.

The first and second sealing members may be formed of a glass frit.

The reinforcement member may be formed of a polymer resin.

The reinforcement member may be formed between the first and second sealing members by being injected between the first and second substrates through a spraying method.

The first and second sealing members may be formed to be spaced apart from each other at a predetermined distance on the first substrate through a screen printing method.

The predetermined distance may be within 100 μm.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
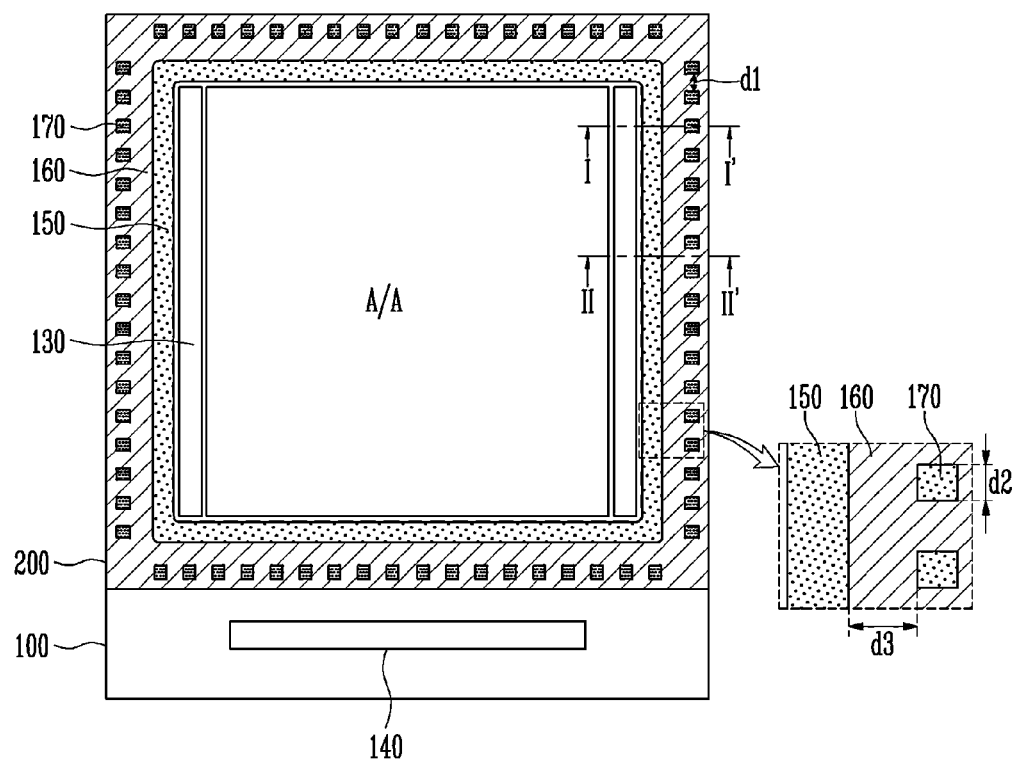
FIG. 1 is a plan view schematically showing an organic light emitting display according to an embodiment of the present invention.

In the following detailed description, only certain example embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals refer to like elements. In the drawings, the thickness or size of layers are exaggerated for clarity and not necessarily drawn to scale.

Figure 2:
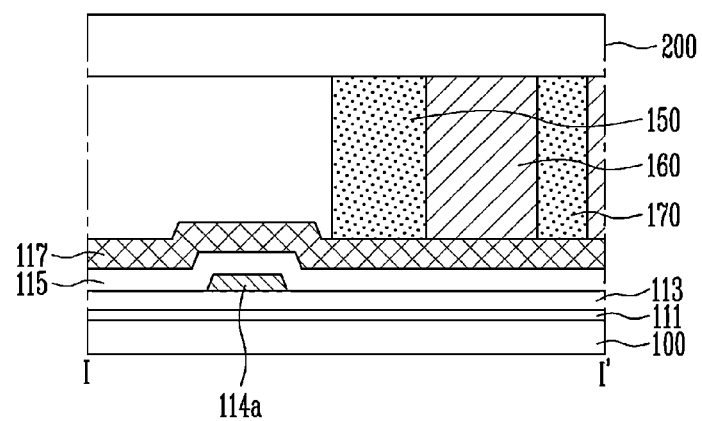
FIG. 2 is a sectional view taken along line I-I' of the organic light emitting display of FIG. 1.
Figure 3:
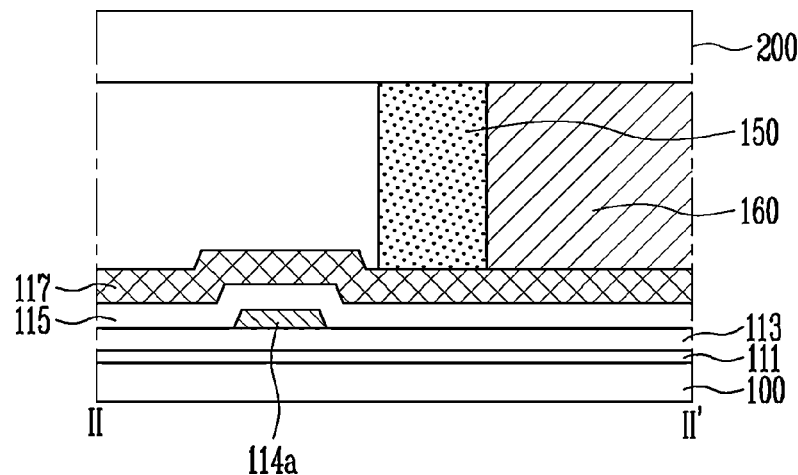
FIG. 3 is a sectional view taken along line II-II' of the organic light emitting display of FIG. 1.

FIG. 1 is a plan view schematically showing an organic light emitting display according to an embodiment of the present invention. FIG. 2 is a sectional view taken along line I-I' of the organic light emitting display of FIG. 1. FIG. 3 is a sectional view taken along line II-II' of the organic light emitting display of FIG. 1.

Referring to FIGS. 1 to 3, the organic light emitting display according to this embodiment includes a first substrate 100 configured to have a display area A/A, and a second substrate 200 opposing to the first substrate 100.

The first substrate 100 may be made of transparent glass material having $SiO_2$ as a main component. The first substrate 100 is not necessarily limited thereto, and may be formed of a transparent plastic material. The plastic material forming the first substrate 100 may be an insulative organic material.

In case of a bottom emission type where an image is implemented in the direction of the substrate 100, the first substrate 100 may be formed of a transparent material. In the case of a front emitting type where an image is implemented in the opposite direction of the first substrate 100, the first substrate 100 is not necessarily formed of a transparent material. In this case, the first substrate 100 may be formed of a metal. When the first substrate 100 is formed of a metal, the first substrate 100 may include at least one metal selected from the group consisting of carbon, iron, chromium, manganese, nickel, titanium, molybdenum, stainless steel (SUS), invar alloy, inconel alloy and kovar alloy, but the present invention is not limited thereto. The first substrate 100 may be formed of a metal foil, a metal sheet or a metal plate.

The display area A/A of the substrate 100 includes a plurality of pixels (not shown) defined by a plurality of scan lines and a plurality of data lines. Each of the plurality of pixels may be configured to include a switching transistor, a driving transistor, a capacitor and an organic light emitting diode. Hereinafter, the structure of the sub-pixel will be described with reference to FIG. 4.

Figure 4:
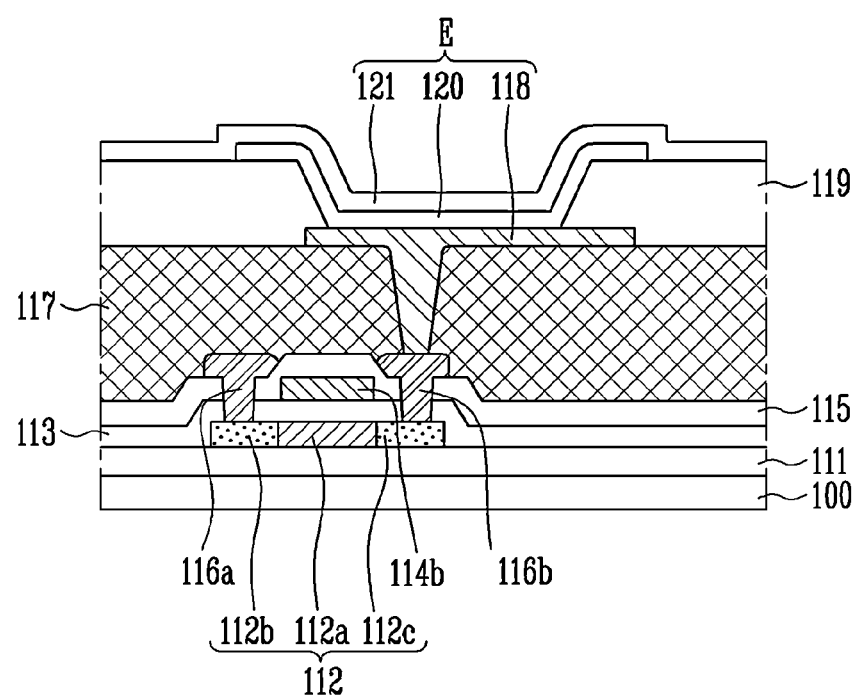
FIG. 4 is a sectional view of a display area of FIG. 1.

In embodiments, as shown in FIG. 4, a buffer layer 111 formed on the first substrate 100. In a sub-pixel, a semiconductor layer 112 is formed on the buffer layer 111. The semiconductor layer 112 includes a source area 112b, an active area 112a and a drain area 112c. A first insulating layer 113 is formed on the semiconductor layer 112, and a gate electrode 114b is formed on the first insulating layer 113. A second insulating layer 115 is formed on the gate electrode 114b, source and drain electrodes 116a and 116b formed on the second insulating layer 115, and a protection layer 117 is formed on the source and drain electrodes 116a and 116b.

In embodiments, a first electrode 118 is formed on the protection layer 117, a pixel defining layer 119 is provided with an opening or a hole through which one area of the first electrode 118 is exposed, an organic emission layer 120 is formed on the pixel defining layer 119, and a second electrode 121 is formed on the pixel defining layer 119 and the organic emission layer 120.

In embodiments, the semiconductor layer 112, the gate electrode 114b and the source and drain electrodes 116a and 116b constitute a thin film transistor, and the first electrode 118, the organic emission layer 120 and the second electrode 121 constitute an organic light emitting diode E.

The buffer layer 111 performs a function of protecting the semiconductor layer 112 formed in a subsequent process from the penetration of particles such as alkali ions, which is discharged from the first substrate 100, and planarizing the surface of the first substrate 100. The buffer layer 111 is not necessarily essential, and may be omitted according to the kind and process conditions of the first substrate 100.

The semiconductor layer 112 is formed on the buffer layer 111, and includes the active area 112a into which an impurity is not injected, and the source and drain areas 112b and 112c formed by injecting a p-type or n-type impurity into both sides of the active area 112a. The impurity may be changed depending on a kind of a thin film transistor.

The first insulating layer 113 includes openings or contact holes to allow portions of the respective source and drain areas 112b and 112c to be exposed therethrough. The first insulating layer 113 may include an inorganic insulating material having a single layer configured with one kind of layer selected from silicon oxide ($SiO_2$), silicon nitride (SiN) and silicon oxynitride (SiON), or a stacked layer configured with two or more kinds of layers selected from silicon oxide ($SiO_2$), silicon nitride (SiN) and silicon oxynitride (SiON).

The gate electrode 114b is formed at a position overlapping the active area 112a of the semiconductor layer 112 on the first insulating layer 113. The gate electrode 114b may be formed in a single-layered structure of one or mixture selected from the group consisting of molybdenum (Mo), tungsten (W), aluminum neodymium (AlNd), titanium (Ti), aluminum (Al), silver (Ag) and alloy thereof, or be formed in a double-layered or multi-layered structure of Mo, Al and Ag, which are low-resistance materials so as to reduce wiring resistance. In embodiments, the gate electrode 114b may be formed by sequentially stacking conductive layers of a multi-layered structure so as to reduce wiring resistance. Specifically, the gate electrode 114b may have a multi-layered structure composed of Mo/Al/Mo, MoW/AlNd/MoW, Mo/Ag/Mo, Mo/Ag alloy/Mo, or Ti/Al/Mo.

The second insulating layer 115 is formed of any one selected from inorganic and organic insulating materials on the first insulating layer 113 including the gate electrode 114b, and includes the openings or contact holes through which the portions of the respective source and drain areas 112b and 112c are exposed.

The source and drain electrodes 116a and 116b are formed on the second insulating layer 115. The source and drain electrodes 116a and 116b are respectively connected to the source and drain areas 112b and 112c through the openings or vias formed in the first and second insulating layers 113 and 115. The source and drain electrodes 116a and 116b may be formed in a single-layered structure of one or mixture selected from the group consisting of Mo, W, MoW, AlNd, Ti, Al, Ag and alloy thereof, or be formed in a double-layered or multi-layered structure of Mo, Al and Ag, which are low-resistance materials so as to reduce wiring resistance.

The protection layer 117 is formed of any one selected from inorganic and organic insulating materials on the source and drain electrodes 116a and 116b, and includes an opening or a hole through which a portion of the drain electrode 116b are exposed to an outside of the protection layer 117.

The first electrode 118 acts as an anode electrode, and is formed on the protection layer 117 to be electrically connected to the drain electrode 116b through the opening of the protection layer 117. The pixel defining layer 119 is formed on the first electrode 118, and includes an opening through which a portion of the first electrode 118 is exposed. The organic emission layer 120 is formed on the first electrode 118 through the opening of the pixel defining layer 119, and may be a low or high molecular organic layer. The second electrode 121 is formed on the pixel defining layer 119 including the organic emission layer 120, and acts as a cathode electrode. The polarities of the first and second electrodes 118 and 121 may oppose each other.

In case of the bottom emission type where an image is implemented in the direction of the first substrate 100, the first electrode 118 may be a transparent electrode, and the second electrode 121 may be a reflective electrode. In this state, the first electrode 118 may be formed of ITO, IZO, ZnO, $In_2O_3$ or the like which has a high work function, and the second electrode 121 may be formed of a metal having a low work function, such as Ag, Mg, Al, Pt, Pd, Au, Ni, Ir, Cr, Li or Ca.

In case of a top emission type where an image is implemented in the direction of the second electrode 121, the first electrode 118 may be a reflective electrode, and the second electrode 121 may be a transparent electrode. In this state, the reflective electrode as the first electrode 118 may include a reflection layer formed of Ag, Mg, Al, Pt, Pd, Au, Ni, Nd, Ir, Cr, Li, Ca, and a compound thereof, and ITO, IZO, ZnO or $In_2O_3$ having a high work function. The transparent electrode as the second electrode 121 may be formed by depositing a metal having a low work function, such as Ag, Mg, Al, Pt, Pd, Au, Ni, Nd, Ir, Cr, Li, Ca and a compound thereof, and then forming an auxiliary electrode layer or bus electrode line on the metal, using a transparent conductive material such as ITO, IZO, ZnO or $In_2O_3$.

In case of a both-side emission type, both the first and second electrodes 118 and 121 may be transparent electrodes.

A first driver 130 for supplying a scan signal to the scan lines is formed at a left/right edge of the display area A/A.

The first substrate 100 having the display area A/A is bonded to the second substrate 200 disposed above the display area A/A.

The second substrate 200 may be not only a glass substrate but also various plastic substrates such as acryl, and furthermore, a metal substrate. In embodiments, the second substrate or cover plate 200 may be formed smaller than the first substrate 100, and accordingly, a portion of the first substrate 100 is exposed. A second driver 140 for supplying a data signal to the data lines may be provided at the exposed portion of the first substrate 100.

Meanwhile, the first and second substrates 100 and 200 are bonded and sealed together by a first sealing member 150 positioned therebetween.

In embodiments, the first sealing member 150 is formed of a glass frit material that is a transparent material, to prevent the penetration of moisture and oxygen from the outside, and forms a rectangular closed loop surrounding the display area A/A of the first substrate 100.

The frit originally means a powdery glass material including additives, but also means a glass generally formed by melting a frit in the field of glass. Accordingly, the frit is used to mean both of the glasses in this specification.

The first sealing member 150 may be configured to include an organic material, a moisture-absorbing material for absorbing laser, a filler for reducing a thermal expansion coefficient, etc., and is applied to the first and second substrates 100 and 200 opposing each other in a state of frit paste including an organic binder, melted and cured by laser or infrared light between the first and second substrates 100 and 200, thereby sealing the first and second substrates 100 and 200.

The first sealing member 150 is a main member for sealing the first and second substrates 100 and 200, and performs a function of preventing oxygen and moisture from the outside from penetrating into the display area A/A.

The first and second substrates 100 and 200 are bonded and sealed together by the first sealing member 150 and a plurality of pillar members or column members 170 formed at the outside of the first sealing member 150.

Like the first sealing member 150, the plurality of pillar members 170 are formed of a glass frit material. The plurality of pillar members 170 are spaced apart from the first sealing member 150 at a predetermined distance d3 at the outside of the first sealing member 150, to improve the mechanical strength of the first and second substrates 100 and 200.

In embodiments, the distance d3 between the first sealing member 150 and the pillar members 170 may be designed to be about a few to a few tens of μm.

The plurality of pillar members 170 are spaced apart from each other at a predetermined distance d1. In embodiments, the distance d1 may be within about a few hundreds of μm. In an embodiment, the distance d1 may be smaller than or about 100 μm.

The width d2 of each of the plurality of pillar members 170 may be designed to be about a few to a few hundreds of μm. The plurality of pillar members 170 may have a square shape as shown in FIG. 1, but in alternative embodiments, the pillar members 170 may have one of various shapes such as rectangular, circular and elliptical shapes.

The plurality of pillar members 170 are auxiliary members for bonding and interconnecting together the first and second substrates 100 and 200, and performs a function of preventing damage of the first sealing member 150 by increasing the bonding area of the first and second substrates 100 and 200 and blocking an impact generated from the outside and transferred to the first sealing member 150.

When cutting an intermediate product including two mother substrates and arrays of pixels disposed between the two mother substrates into organic light emitting displays, the pressure of a cutting wheel is applied to the mother substrate. In this state, an impact caused by the applied pressure may be transferred to the plurality of pillar members 170. However, since the plurality of pillar members 170 are spaced apart from each other at the predetermined distance d1 and support the mother substrate at a location near or at the cutting line, it is possible to block or minimize the transfer of the impact to the first sealing member 150, thereby reducing or minimizing the damage of the first sealing member 150. (See FIG. 6.) In embodiments, the cutting line may be an imaginary line that a cutting tool follows. In alternative embodiments, the cutting line is formed on one of the mother substrates.

A side of the display may be formed at the outside of the plurality of pillar members 170 by cutting the intermediate product having the mother substrates along the cutting line.

A reinforcement member 160 is formed between the first and second substrates. In embodiments, the reinforcement member 160 may have portions disposed between the first sealing member 150 and the pillar members and 170. In embodiments, the reinforcement member 160 is formed of a polymer resin having a bonding force to the substrate greater than that of the material of the first sealing member 150 and the pillar members 170. Thus, the reinforcement member 160 can complement the bonding force of the first and second substrates 100 and 200. Further, the reinforcement member 160 absorbs an impact generated from the substrate, thereby improving the entire mechanical strength of the organic light emitting display.

The reinforcement member 160 may include at least one resin selected from the group consisting of epoxy, acrylic and urethane based resins.

The reinforcement member 160 may be formed by injecting between the first and second substrates 100 and 200 using a spraying method or the like after cutting the intermediate product having the bonded and sealed first and second mother substrates into respective organic light emitting displays.

In embodiments, the reinforcement member 160 is formed between the first sealing member 150 and the pillar members 170, between immediately neighboring pairs of the plurality of pillar members 170 spaced apart from each other at the predetermined distance d1, and between the plurality of pillar members 170 and the edge which is formed by cutting the mother substrate along the cutting line, thereby complementing the bonding force between the first and second substrates 100 and 200.

In the organic light emitting display and the manufacturing method for the same according to this embodiment, the transfer of the impact from the outside to the first sealing member 150 is minimized through the plurality of pillar members 170, so that it is possible to reduce or minimize the damage of the first sealing member 150 and to effectively bond and seal together the first and second substrates 100 and 200.

Figure 5:
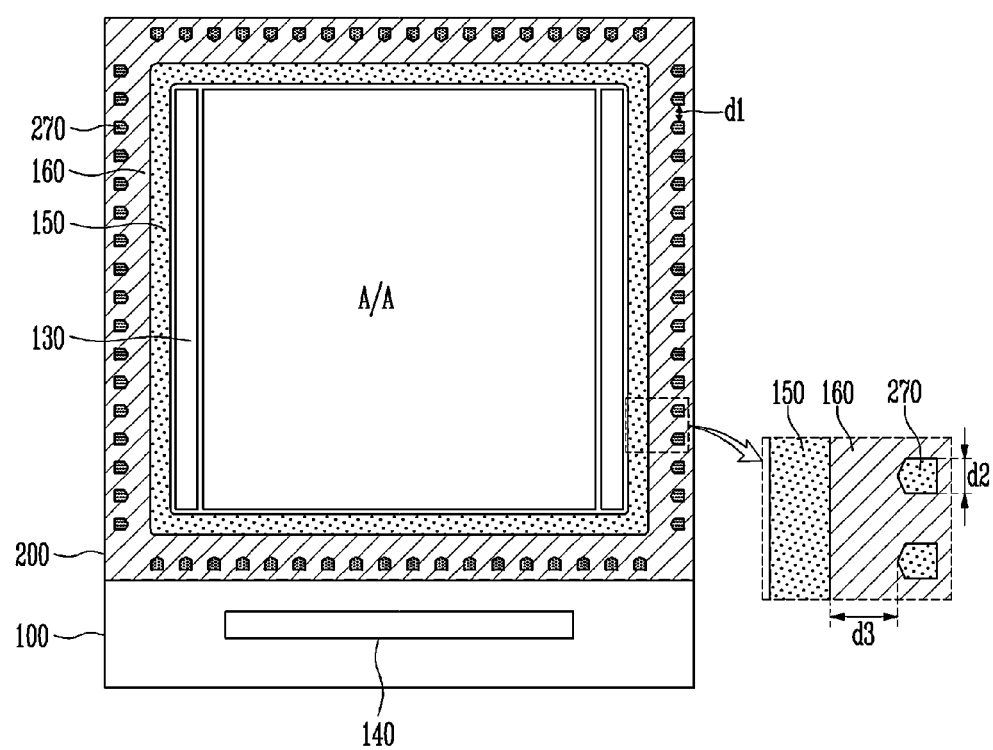
FIG. 5 is a plan view schematically showing an organic light emitting display according to another embodiment of the present invention.

FIG. 5 is a plan view schematically showing an organic light emitting display according to another embodiment of the present invention. In FIG. 5, components identical to those of the aforementioned embodiment are designated by like reference numerals, and their detailed descriptions will be omitted. Different portions from those of the aforementioned embodiment will be mainly described.

Referring to FIG. 5, the organic light emitting display according to this embodiment includes first and second substrates 100 and 200, a first sealing member 150 positioned at an outside of a display area A/A between the two substrates 100 and 200, a reinforcement member 160 positioned at an outside of the first sealing member 150, and a plurality of pillar members 270 positioned at an outside of the reinforcement member 160.

The first sealing member 150 and the plurality of pillar members 270 are formed of a glass frit material, and the reinforcement member 160 is formed of a polymer resin.

The plurality of pillar members 270 are spaced apart from each other at a predetermined distance d1, and may be formed in a polygonal shape having a width narrowed in the direction to the first sealing member 150 when viewed in a viewing direction perpendicular to a major surface of the first substrate. The width of the second sealing member 270 is narrowed in the direction to the first sealing member 150 so that the reinforcement member 160 in a liquid state is easily injected or transmitted to places between the first sealing member 150 and the plurality of pillar members 270 between the first and second substrates 100 and 200 using a spraying method or the like.

Accordingly, the reinforcement member 160 is formed between the first sealing member 150 and the pillar members 270, between the plurality of pillar members 270 spaced apart from each other at the predetermined distance d1, and between the plurality of pillar members 270 and the cutting line (not shown), thereby further complementing the bonding force between the first and second substrates 100 and 200.

Figure 6:
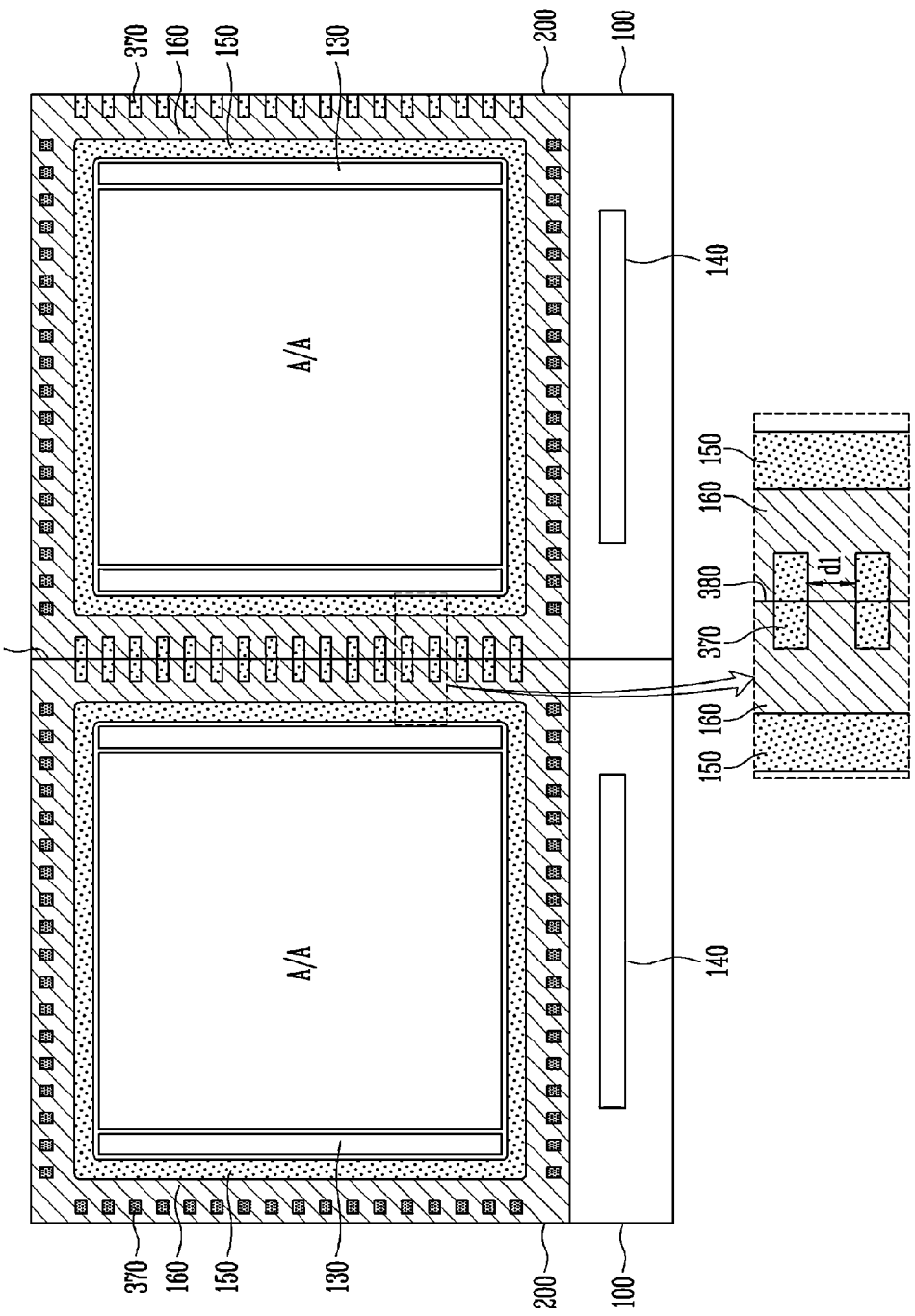
FIG. 6 is a plan view schematically showing an organic light emitting display according to still another embodiment of the present invention.

FIG. 6 is a plan view schematically showing an organic light emitting display according to still another embodiment of the present invention. In FIG. 6, components identical to those of the aforementioned embodiment are designated by like reference numerals, and their detailed descriptions will be omitted. Different portions from those of the aforementioned embodiment will be mainly described.

Referring to FIG. 6, the organic light emitting display according to this embodiment includes a first substrate 100 configured to have two display areas A/A, a second substrate 200 disposed above the display area A/A of the first substrate 100, a first sealing member 150 configured to bond and seal together the first and second substrates 100 and 200, a reinforcement member 160 configured to enhance a bonding force between the first and second substrates 100 and 200, and a plurality of pillar members 370 formed at an outside of the reinforcement member 160.

The organic light emitting display according to this embodiment further includes a cutting line 380 formed above the plurality of pillar members 370 formed in an area between the two display areas A/A.

The first sealing member 150 is formed of a glass frit, and forms a rectangular closed loop along the periphery of the display area A/A, to prevent moisture and oxygen from the outside from penetrating into the display area A/A. In addition, the first sealing member 150 acts as a main sealing member for bonding and sealing together the first and second substrates 100 and 200.

The reinforcement member 160 is disposed at an outside of the first sealing member 150, and formed of a polymer resin having a higher bonding force to the substrate than that of the first sealing member 150. The reinforcement member 160 is formed between the first sealing member 150 and the pillar members 370 by being injected or transferred to space between the first and second substrates 100 and 200 through a spraying method or the like. The reinforcement member 160 enhances the bonding force between the first and second substrates 100 and 200, thereby improving the mechanical strength of the first and second substrates 100 and 200.

The plurality of pillar members 370 are disposed at an outside of the reinforcement member 160, and formed between the first and second substrates 100 and 200, using the same material through the same process as the first sealing member 150. In this state, the first sealing member 150 and the plurality of pillar members 370 may be formed on the first substrate 100 using a screen printing method or the like.

The plurality of pillar members 370 are formed to be spaced apart from each other at a predetermined distance d1 on the first substrate 100, and performs a function of preventing damage of the first sealing member 150 by blocking an impact from the outside from being transferred to the first sealing member 150. In addition, the plurality of pillar members 370 may act as auxiliary bonding members for bonding the first and second substrates 100 and 200.

The plurality of pillar members 370 are positioned in the area between the two display areas A/A, thereby connecting two organic light emitting displays to each other. In this state, the cutting line 380 is formed above the plurality of pillar members 370 positioned in the area between the two display areas A/A, to cut the two organic light emitting displays in the form of a unit cell.

As the cutting line 380 is positioned above the plurality of pillar members 370, each of which is formed to be disposed in two immediately neighboring displays, a separate cutting margin is not provided. This configuration can minimize the dead space of the organic light emitting display.

By way of summation and review, when an external impact is applied to a frit-sealing structure, however, a stress concentration may occur in a contact surface between a frit seal and a substrate, and due to the fragility of the frit material a crack may be generated in the contact surface and propagates throughout the entire substrate. The configuration of the illustrated embodiments may reduce or minimize the generation and/or propagation of such cracks.

As described above, according to embodiments of the present invention, the first sealing member formed of the frit at the periphery of a display unit, the plurality of pillar members formed to be spaced apart from each other at a predetermined distance at the outside of the first sealing member, and the reinforcement member formed between the first and pillar members are provided, so that it is possible to minimize the transfer of an external impact to the first sealing member, thereby preventing damage of the first sealing member.

Further, the reinforcement member having excellent bonding force is formed between the first and pillar members, so that it is possible to increase the bonding force between the substrates, thereby improving the mechanical strength of the organic light emitting display.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display comprising:
a first substrate;
a second substrate opposing the first substrate;
an array of pixels disposed between the first substrate and the second substrate;
a seal member interposed between and bonded to the first and second substrates to seal a gap between the first and second substrates;
a plurality of pillar members positioned between and bonded to the first and second substrates, the plurality of pillar members being positioned outside and spaced from the seal member when viewing in a direction perpendicular to a major surface of the first substrate; and
a reinforcement member disposed between the first and second substrates, and comprising portions disposed between the seal member and the pillar members,
wherein the plurality of pillar members are spaced apart from each other.

2. The organic light emitting display of claim 1, wherein the seal member and the pillar members are formed of the same material.

3. The organic light emitting display of claim 2, wherein the seal member and the pillar members are formed of glass frit.

4. An organic light emitting display comprising:
a first substrate;
a second substrate opposing the first substrate;
an array of pixels disposed between the first substrate and the second substrate;
a seal member interposed between and bonded to the first and second substrates to seal a gap between the first and second substrates;
a plurality of pillar members positioned between and bonded to the first and second substrates, the plurality of pillar members being positioned outside and spaced from the seal member when viewing in a direction perpendicular to a major surface of the first substrate; and
a reinforcement member disposed between the first and second substrates, and comprising portions disposed between the seal member and the pillar members,
wherein the plurality of pillar members are spaced apart from each other,
wherein the reinforcement member is formed of a polymer resin.

5. The organic light emitting display of claim 1, wherein the plurality of pillar members are spaced apart from each other at a predetermined distance of about 100 μm or smaller.

6. The organic light emitting display of claim 1, wherein the seal member and each of the pillar members are spaced apart from each other at a predetermined distance.

7. The organic light emitting display of claim 1, wherein the first and second substrates respectively comprise first and second side surfaces which are placed in a plane and collectively form a side of the organic light emitting display.

8. The organic light emitting display of claim 7, wherein the pillar members comprise third side surfaces placed in the plane.

9. The organic light emitting display of claim 8, wherein the first, second and third side surfaces are formed by cutting along a cutting line.

10. The organic light emitting display of claim 8, wherein the reinforcement member comprises a fourth side surface placed in the plane.

11. The organic light emitting display of claim 7, wherein the pillar members are placed between the seal member and the side when viewing in the direction.

* * * * *